United States Patent
Choki et al.

(10) Patent No.: US 8,208,769 B2
(45) Date of Patent: Jun. 26, 2012

(54) SUBSTRATE FOR MOUNTING AN OPTICAL ELEMENT, OPTICAL CIRCUIT SUBSTRATE, AND SUBSTRATE ON WHICH AN OPTICAL ELEMENT IS MOUNTED

(75) Inventors: Koji Choki, Kawasaki (JP); Mutsuhiro Matsuyama, Kawasaki (JP); Kenji Miyao, Yokohama (JP); Keizo Takahama, Chigasaki (JP); Tetsuya Mori, Kawasaki (JP); Kei Watanabe, Kawasaki (JP); Hiroshi Owari, Yokohama (JP); Yoji Shirato, Yokohama (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 107 days.

(21) Appl. No.: 12/784,530

(22) Filed: May 21, 2010

(65) Prior Publication Data

US 2010/0226606 A1    Sep. 9, 2010

Related U.S. Application Data

(62) Division of application No. 12/302,627, filed as application No. PCT/JP2007/061000 on May 30, 2007, now Pat. No. 7,869,670.

(30) Foreign Application Priority Data

May 30, 2006   (JP) ................... 2006-149743

(51) Int. Cl.
  *G02B 6/10* (2006.01)
  *G02B 6/12* (2006.01)
(52) U.S. Cl. .......... 385/14; 385/129; 385/130; 385/131; 385/132
(58) Field of Classification Search ............ 385/14, 385/129–132
  See application file for complete search history.

(56) References Cited

U.S. PATENT DOCUMENTS

| 6,611,635 | B1 | 8/2003 | Yoshimura et al. |
| 7,092,603 | B2 | 8/2006 | Glebov et al. |
| 7,120,325 | B1* | 10/2006 | Uchida ............ 385/14 |
| 7,639,912 | B2 | 12/2009 | Wang et al. |
| 2003/0128907 | A1* | 7/2003 | Kikuchi et al. ........ 385/14 |
| 2005/0117201 | A1* | 6/2005 | Yamane et al. ....... 359/333 |

FOREIGN PATENT DOCUMENTS

| EP | 1 477 832 A1 | 11/2004 |
| JP | 6-167622 | 6/1994 |
| JP | 2002-174744 | 6/2002 |
| JP | 2002-182049 | 6/2002 |
| JP | 2003-161853 | 6/2003 |
| JP | 2005-84126 | 3/2005 |

* cited by examiner

*Primary Examiner* — Ryan Lepisto
*Assistant Examiner* — Jerry Blevins
(74) *Attorney, Agent, or Firm* — Oblon, Spivak, McClelland, Maier & Neustadt, L.L.P.

(57) ABSTRACT

A substrate on which an optical element is mounted is provided, including: an optical element; an optical circuit substrate which is formed by an optical waveguide layer having a core portion and cladding portions; and an electrical circuit substrate on which is provided a mounting portion that is used for mounting the optical element, wherein the optical element is mounted on the electrical circuit substrate via the optical circuit substrate and wherein the optical circuit substrate has an optical element mounted thereon and is provided with a receptor structure having a conductive portion that conducts electricity between an electrode of the optical element and an electrode of the electrical circuit substrate.

14 Claims, 9 Drawing Sheets

SUBSTRATE FOR MOUNTING AN OPTICAL ELEMENT, OPTICAL CIRCUIT SUBSTRATE, AND SUBSTRATE ON WHICH AN OPTICAL ELEMENT IS MOUNTED

CROSS-REFERENCE TO RELATED APPLICATIONS

This application is a divisional of and claims the benefit of priority under 35 U.S.C. §120 from U.S. Ser. No. 12/302,627, filed Nov. 26, 2008, the entire content of which is incorporated herein by reference. The U.S. Ser. No. 12/302,627 is a national stage of PCT/JP07/61000, filed May 30, 2007, and claims the benefit of priority under 35 U.S.C. §119 of Japanese Application No. 2006-149743, filed May 30, 2006.

TECHNICAL FIELD

The present invention relates to a substrate for mounting an optical element, an optical circuit substrate, and a substrate on which an optical element is mounted.

BACKGROUND ART

In recent years, there have been even greater demands for increased miniaturization and increased performance in electronic instruments. Among these, in order to deal with increasing signal speeds, investigations have been made into increasing the speed of signal transmission paths inside an electronic instrument by connecting together electronic components by means of optical signals. In connections which are made using optical signals, a mixed optical-electrical substrate is used on which are provided both optical wiring and electrical wiring, and the optical wiring has an optical waveguide that is formed by a core portion and a cladding portion, and an optical signal is transmitted as a result of light being propagated along the core portion of the optical waveguide.

In an electronic instrument which is provided with this type of optical-electrical substrate, an effective structure is one in which electronic components are mounted on the substrate, and input signals of these electronic components are converted into optical signals using an optical element, and are then propagated over an optical waveguide. At the destination of these optical signals, they are restored to the form of electrical output signals using another optical element, and are connected to another electronic component.

Conventionally, advances have been made towards integration with rigid substrates such as optical waveguides being formed in a rigid substrate. For example, an optical element and an electronic component are mounted on the substrate. Electrical signals are propagated from the surface of the substrate on which the optical element and electronic component are mounted, to the surface on the opposite side on which electrical wiring is formed, via electrical wiring that goes through the substrate and connects between these surfaces. Optical signals are propagated by means of an optical waveguide that is formed in the substrate, and pass from the optical waveguide through a non-conductive layer and are transmitted to a light receiving or emitting portion of an optical element (see, for example, Patent document 1).

However, in a structure such as this, there are limits on the degree of miniaturization, for example, limits of thinning. Moreover, due to a distance between the light receiving or emitting portion of the optical element and the core portion of the optical waveguide, this has an effect on the efficiency of the optical input from the light-emitting portion to the core portion, and problems arise in characteristics such as optical propagation loss and the like. Furthermore, increased positioning accuracy between the light receiving or emitting portion of an optical element and the core portion of the optical waveguide is required to solve problems such as these.

Patent document 1: Japanese Unexamined Patent Application, First Application No. 2002-182049

DISCLOSURE OF THE INVENTION

Problems to be Solved by the Invention

The present invention provides a substrate on which an optical element can be mounted that makes it possible to reduce optical propagation loss, and provides an optical element mounted optical circuit substrate and a substrate for mounting an optical element that have superior positioning accuracy when an optical element is being mounted thereon.

Means for Solving the Problem

The above described problems are solved by the substrate for mounting an optical element of the present invention according to (1) through (9) below, the optical circuit substrate of the present invention according to (10) through (17) below, and the substrate on which an optical element is mounted of the present invention according to (18) through (29) below.

(1) A substrate for mounting an optical element that is formed so as to include an optical circuit substrate which is formed by an optical waveguide layer having a core portion and cladding portions, and an electrical circuit substrate on which is provided a mounting portion that is used for mounting an optical element, and in which an optical element is mounted on the electrical circuit substrate via the optical circuit substrate, wherein the optical circuit substrate is provided with a receptor structure in order to achieve electrical conduction between an electrode of the optical element and an electrode of the electrical circuit substrate.

(2) The substrate for mounting an optical element according to (1), wherein the receptor structure includes a conductive portion inside the receptor structure that is used to form a metal bond between the electrode of the optical element and the electrode of the electrical circuit substrate.

(3) The substrate for mounting an optical element according to (2), wherein the conductive portion includes a conductive post that is provided on a bottom portion on the electrical circuit substrate side inside the receptor structure.

(4) The substrate for mounting an optical element according to (3) wherein the conductive post protrudes beyond the optical-element-mounting surface of the optical circuit substrate.

(5) The substrate for mounting an optical element according to any one of (1) through (4), wherein the optical circuit substrate has a conductive circuit on the optical waveguide layer.

(6) The substrate for mounting an optical element according to any one of (1) through (5), wherein the optical circuit substrate has a conductive circuit that is connected to the conductive post on a bonding surface where it is bonded with the electrical circuit substrate.

(7) The substrate for mounting an optical element according to any one of (1) through (6), wherein the optical circuit substrate has a conductive circuit on the optical-element-mounting side surface, and a conductive portion that penetrates the optical circuit substrate and is metal-bonded to the electrode of the electrical circuit substrate on the conductive circuit.

(8) The substrate for mounting an optical element according to any one of (1) through (7), wherein the optical circuit substrate has an optical path changing portion in the core portion that bends the optical path of the core portion towards a light receiving and emitting portion of the optical element.

(9) The substrate for mounting an optical element according to any one of (1) through (8), wherein the substrate on which an optical element is mounted has a structure in which two of the electrical circuit substrates are joined in a bridge structure by the optical circuit substrate.

(10) An optical circuit substrate for mounting an optical element is mounted that is formed so as to include an optical circuit substrate which is formed by an optical waveguide layer having a core portion and cladding portions, and an electrical circuit substrate on which is provided a mounting portion that is used for mounting an optical element, and in which an optical element is mounted on the electrical circuit substrate via the optical circuit substrate, wherein the optical circuit substrate is provided with a receptor structure in order to achieve electrical conduction between an electrode of the optical element and an electrode of the electrical circuit substrate.

(11) The optical circuit substrate according to (10), wherein the receptor structure includes a conductive portion inside the receptor structure that is used to form a metal bond between the electrode of the optical element and the electrode of the electrical circuit substrate.

(12) The optical circuit substrate according to (11), wherein the conductive portion includes a conductive post that is provided on a bottom portion on the electrical circuit substrate side inside the receptor structure.

(13) The optical circuit substrate according to (12), wherein the conductive post protrudes beyond the optical-element-mounting surface of the optical circuit substrate.

(14) The optical circuit substrate according to any one of (10) through (13), wherein the optical circuit substrate has a conductive circuit on the optical waveguide layer.

(15) The optical circuit substrate according to any one of (12) through (14), wherein the optical circuit substrate has a conductive circuit that is connected to the conductive post of the conductive portion inside the receptor structure on a bonding surface where it is bonded with the electrical circuit substrate.

(16) The optical circuit substrate according to any one of (10) through (15), wherein the optical circuit substrate has a conductive circuit on the optical-element-mounting side surface, and a conductive portion that penetrates the optical circuit substrate and is metal-bonded to the electrode of the electrical circuit substrate on the conductive circuit in order to achieve electrical conductivity with the electrical circuit substrate.

(17) The optical circuit substrate according to any one of (10) through (16), wherein the optical circuit substrate has an optical path changing portion in the core portion that bends the optical path of the core portion towards a light receiving and emitting portion of the optical element.

(18) A substrate on which an optical element is mounted that is formed so as to include an optical circuit substrate which is formed by an optical waveguide layer having a core portion and cladding portions, and an electrical circuit substrate on which is provided a mounting portion that is used for mounting an optical element, and in which an optical element is mounted on the electrical circuit substrate via the optical circuit substrate, wherein the optical circuit substrate has an optical element mounted thereon and is provided with a receptor structure having a conductive portion that conducts electricity between an electrode of the optical element and an electrode of the electrical circuit substrate.

(19) The substrate on which an optical element is mounted according to (18), wherein, in the receptor structure, the electrode of the optical element and the electrode of the electrical circuit substrate are metal-bonded by a conductive portion inside the receptor structure.

(20) The substrate on which an optical element is mounted according to (18) or (19), wherein the conductive portion in the receptor structure is formed by a projection portion which is provided on the electrode of the optical element.

(21) The substrate on which an optical element is mounted according to any one of (18) through (20), wherein the conductive portion in the receptor structure is formed so as to include a conductive post that is provided on the bottom portion on the electrical circuit side inside the receptor structure.

(22) The substrate on which an optical element is mounted according to any one of (18) through (21), wherein, in the conductive portion in the receptor structure, the conductive post which is protruding beyond the optical-element-mounting surface of the optical circuit substrate is metal-bonded to the electrode of the optical element.

(23) The substrate on which an optical element is mounted according to any one of (18) through (22), wherein the conductive portion in the receptor structure is formed by the projection portion which is provided on the electrode of the optical element and the conductive post.

(24) The substrate on which an optical element is mounted according to any one of (18) through (23), wherein the optical circuit substrate has a conductive circuit on the optical waveguide layer.

(25) The substrate on which an optical element is mounted according to any one of (18) through (24), wherein the optical circuit substrate has a conductive circuit that is connected to the conductive post of the conductive portion in the receptor structure on a bonding surface where it is bonded with the electrical circuit substrate.

(26) The substrate on which an optical element is mounted according to any one of (18) through (25), wherein the optical circuit substrate has a conductive circuit on the optical-element-mounting side surface, and a conductive portion that penetrates the optical circuit substrate and is metal-bonded to the electrode of the electrical circuit substrate on the conductive circuit.

(27) The substrate on which an optical element is mounted according to any one of (18) through (26), wherein the optical circuit substrate has an optical path changing portion in the core portion that bends the optical path of the core portion towards a light receiving and emitting portion of the optical element.

(28) The substrate on which an optical element is mounted according to any one of (18) through (27), wherein the substrate on which an optical element is mounted has a structure in which two of the electrical circuit substrates are joined in a bridge structure by the optical circuit substrate.

(29) The substrate on which an optical element is mounted according to any one of (18) through (28), wherein the substrate on which an optical element is mounted is obtained by positioning the optical-element-mounting portion of the electrical circuit substrate relative to the receptor structure portion of the optical circuit substrate, by mounting the optical element on the optical circuit substrate, and by metal bonding them together via the conductive portion inside the receptor structure.

Effects of the Invention

According to the present invention, a substrate on which an optical element is mounted having high mounting accuracy and that makes it possible to reduce loss in optical propagation is obtained. Because the substrate on which an optical element is mounted of the present invention has a short distance between the light receiving or emitting portion of the optical element and the core portion of the optical waveguide, it is possible to efficiently transmit light and to obtain a reduction in thickness.

According to the present invention, a substrate for mounting an optical element and an optical circuit substrate on which an optical element is mounted are obtained in which it is easy to mount the optical element and superiorly accurate to position in mounting the optical element. In the substrate for mounting an optical element of the present invention, the optical circuit substrate and the electrical circuit substrate are individually prepared, and because it is sufficient if they have a portion where it is possible for the optical element to be mounted, and because it is sufficient for the electrical circuit substrate to be provided with at least an optical-element-mounting portion, it is possible to achieve a reduction in size and to increase the degree of designing flexibility of devices.

The above described and any additional objects, operations and effects of the present invention are obvious to one skilled in the art from the drawings and from the description of the embodiments of the present invention.

DESCRIPTION OF THE REFERENCE NUMERALS

Figure 1A:
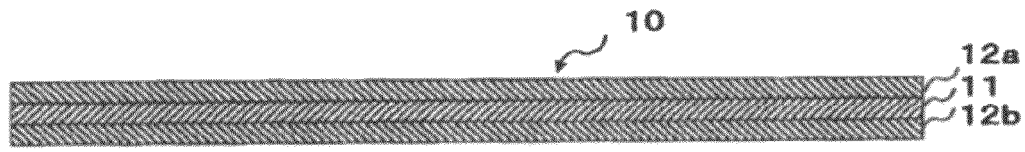
FIG. 1A is a cross-sectional view used to illustrate an optical waveguide layer in an example of a first optical circuit substrate (G1).

10 Optical waveguide layer
11 Core layer
12*a*, 12*b* Cladding layer 13 Through hole for a receptor structure
14 Optical path changing portion
15 Optical circuit substrate (G1)
31 Metal plate
32 Conductive post
33 Conductive circuit
34 Gold plating layer
35 Optical circuit substrate (G2)
41 Metal plate
42 Conductive post
43 Conductive circuit
44a, 44b Gold plating layer
45 Optical circuit substrate (G3)
46 Conductive post
47a, 47b Gold plating layer
48 Optical circuit substrate (G4)
50 Electrical circuit substrate
50' Electrical circuit substrate having a gold plating layer on an optical element mounted portion (land)
50" Electrical circuit substrate having an adhesive layer
51 Core substrate
52 Aperture portion
53 Conductive circuit
54 Gold plating layer
55 Adhesive layer
60 Optical element
60' Optical element having a light emitting point
60" Optical element having a light receiving point
61, 61' Metal projection portion
61a Metal projection portion on a signal wire connection electrode
61b Metal projection portion on a ground connection electrode
61c Metal projection portion for position fixing
62 Light receiving/emitting point
63 Substrate for mounting an optical element (G1)
64 Substrate on which an optical element is mounted (G1)
65 Substrate for mounting an optical element (G2)
66 Substrate on which an optical element is mounted (G2)
67 Substrate for mounting an optical element (G3)
68 Substrate on which an optical element is mounted (G3)
69 Substrate for mounting an optical element (G4)
70 Substrate on which an optical element is mounted (G4)

BEST EMBODIMENTS FOR CARRYING OUT THE INVENTION

With reference made to the drawings, the optical circuit substrate, substrate for mounting an optical element, and substrate on which an optical element is mounted of the present invention will now be described in detail.

It should be noted that, in the present specification, the term 'substrate on which an optical element is mounted' refers to an object formed by assembling together an optical element, an optical circuit substrate, and an electrical circuit substrate. The term 'substrate for mounting an optical element' refers to an object formed by assembling together an optical circuit substrate and an electrical circuit substrate.

The receptor structure in the present invention is a structure that includes through holes for mounting an optical element that are provided on an optical circuit substrate, and in which the through holes electrically connect the optical element and the electrical circuit by means of an electrical conductor. Moreover, the through holes can also be used as positioning portions for the light receiving or emitting portions of the optical element and the core portion of the optical waveguide.

Examples of an optical element in the present invention include a light receiving element and a light emitting element.

The optical circuit substrate of the present invention is formed by an optical waveguide layer having a core portion and cladding portions, and is provided with a receptor structure or with through holes for a receptor structure that make it possible to achieve electrical conduction between an electrode of the optical element and an electrode of the electrical circuit substrate when an optical element is mounted on an optical-element-mounting portion of the electrical circuit substrate. It is also possible for the optical circuit substrate to have conductive posts or the like in the cladding portion that penetrate either the electrical circuit or the electrical circuit and the optical circuit substrate so as to achieve electrical conduction between two surfaces.

Firstly, elements that make up the optical circuit substrate according to the present invention, namely, the 'optical waveguide', the 'core layer', the 'cladding layers', the 'optical path changing portion', and the 'receptor structure portion' and the like will be described in this order.

(Optical Waveguide)

Firstly, an optical waveguide layer 10 such as that shown in FIG. 1A is prepared.

A core portion having a higher refractive index than that of the cladding portion is formed in a core layer 11 shown in FIG. 1A. The optical waveguide layer 10 is formed by the core layer 11 where the core portion is formed, and by a cladding portion that is formed by cladding layers 12a and 12b that are provided on two surfaces of the core layer 11. As a result, light can be transmitted through the interior of the core portion.

In this optical waveguide layer 10, for example, varnish that contains a material for forming the cladding layer is coated onto a substrate so as to form a cladding layer. Next, varnish that contains a material for forming the core layer is coated onto the cladding layer so as to form a core layer. Next, the varnish that contains the material for forming the cladding layer is coated onto the core layer so as to form another cladding layer. At this time, by using a metal plate such as copper or a copper alloy for the substrate, an optical waveguide layer attached to a metal plate is manufactured, and by etching this metal plate so as to form a conductive circuit, it is possible to form a conductive layer on top of the cladding layer. The thickness of the three formed layers is normally, for example, preferably between 70 and 150 μm approximately. Furthermore, the core portion is formed by irradiating actinic radiation onto an intermediate that is formed by the core layer 11 and by the cladding layers 12a and 12b which are provided on both surfaces of the core layer 11. By employing this method, portions of the core layer 11 (described below) excluding the core portion as well as all portions of the cladding layers 12a and 12b make up the cladding portion.

(Core Layer)

Examples of the material that may be used to form the core layer 11 include resin materials such as acrylic resins, epoxy resins, polyimide resins and cyclic olefin resins such as benzocyclobutene resins, norbornene resins and the like. Among these, norbornene resins (particularly addition polymers of norbornene resins) are preferable. As a result, the core layer 11 has superior transparency, flexibility, insulation, and heat resistance. Furthermore, compared with when other resins are used, a low level of moisture absorption can be obtained.

Moreover, the constituent material that is used for the core layer 11 is preferably a material whose refractive index is changed by the irradiation of actinic radiation thereon or by being further heated. Preferable examples of this type of material include those whose principal material is a resin composition containing a cyclic olefin resin such as benzocyclobutene resin and norbornene resin. Among these, those that include (i.e., as their principal material) norbornene resin (particularly addition polymers of norbornene resin) are particularly preferable.

Examples of the active energy rays that are used for the exposure include active energy light rays such as visible light, ultraviolet light, infrared light and laser light, as well as electron beams, X-rays and the like. Electron beams can be irradiated at an irradiation rate of, for example, approximately 50 to 2000 KGy.

(Cladding Layer)

There are no special restrictions on the material that is used to form the cladding layers 12a and 12b provided that it has a lower refractive index than that of the material used to form the core layer 11. Specific examples thereof include resin materials such as acrylic resins, epoxy resins, polyimide resins, and cyclic olefin resins such as benzocyclobutene resins, norbornene resins and the like. Among these, norbornene resins (particularly addition polymers of norbornene resins) are preferable. As a result, the cladding layers 12a and 12b have superior transparency, insulation, flexibility, and heat resistance. Furthermore, compared with when other resins are used, a low level of moisture absorption can be obtained.

For example, in the case of an addition polymer of a norbornene resin, it is possible to adjust the refractive index by means of the type of side chain thereof and the like. Specifically, it is possible to suitably adjust the refractive index by providing an alkyl group, an aralkyl group, an alkyl halide group, a silyloxy group or the like in a side chain of a norbornene resin (an addition polymer is particularly preferable). As a result of this, it is possible to create a refractive index difference from the material making up the core portion.

It is particularly preferable for the material making up the core layer 11 to be an addition polymer of a norbornene resin, and for the material making up the cladding layers 12a and 12b to be an addition polymer of a norbornene resin. As a result, it is possible to obtain improvements especially in heat resistance and toughness.

Specifically, a material having a straight-chain aliphatic group in a side chain is preferable as the (addition polymer of a) norbornene resin making up the cladding layers 12a and 12b. By employing this structure, it is possible to obtain improvements in flexibility and durability. Examples of the straight-chain aliphatic group include a propyl group, a butyl group, a pentyl group, a hexyl group, a heptyl group, an octyl group, a nonyl group, and a decyl group or the like.

Note that the cladding layers 12a and 12b may be formed from the same constituent material, or they may be formed from different constituent materials.

In addition to the method described above, the optical waveguide layer 10 can be obtained by a known method such as a method in which, for example, a core portion is provided in a recessed portion which has been prepared in advance, and the periphery thereof is then covered by a cladding material (i.e., a cladding portion).

(Optical Path Changing Portion)

The optical waveguide layer 10 can be provided with an optical path changing portion that, when an optical element is mounted on the substrate for mounting an optical element, bends the optical path of the core portion of the optical waveguide layer towards the light receiving or emitting element of the optical element in accordance with the mounting position of the optical element.

A method of forming one example of an optical path changing portion will now be described.

Figure 1B:
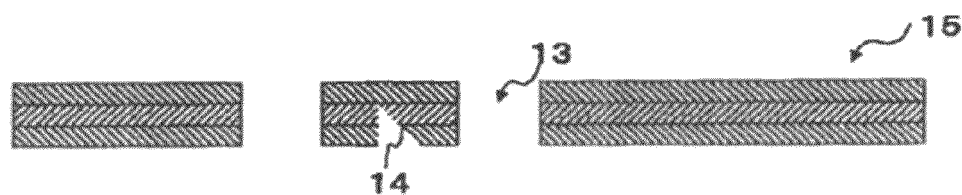
FIG. 1B is a cross-sectional view used to illustrate an example of an optical path changing portion of the optical circuit substrate shown in FIG. 1A.

As is shown in FIG. 1B, an optical path changing portion 14 has an inclined surface that is formed by providing a space having a triangular-shaped cross-section from one surface side of the above described optical waveguide layer 10.

Figure 2:
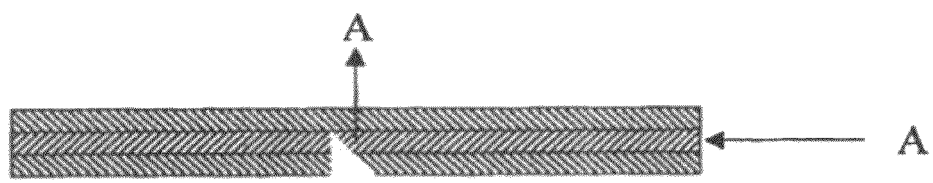
FIG. 2 is a cross-sectional view used to illustrate an optical path changing portion and a light transmission direction in an optical waveguide layer.

The inclined surface is inclined (at a substantially 45° inclination relative to the light transmission direction of the core portion) in the light transmission direction of the core portion which is provided in the core layer 11. As a result, for example, as is shown by the arrow A in FIG. 2, light which is transmitted through the core portion provided in the core layer 11 is totally reflected so that the light transmission direction can be substantially changed at a right angle.

A brief description will be given of a method of forming this type of optical path changing portion. By irradiating a laser onto a portion which will form a reflective portion of the optical waveguide layer 10 which is formed by the core portion and the cladding portions that are bonded to the outer periphery of the core portion, and relatively changing the area where the laser is irradiated onto the optical waveguide layer 10, the irradiation times for which the laser is irradiated onto the portions forming the optical path changing portion of the optical waveguide layer are changed in certain portions, so that the constituent material of the optical waveguide layer is being removed as the level to which the laser reaches in the depth direction of the optical waveguide layer is adjusted. As a result, an optical path changing portion is formed. In this manner, because it is possible to form reflective portions by laser irradiation, it is easy to form an optical path changing portion in a desired pattern and in a desired position. Therefore, it becomes easy to form the pattern for the optical wiring.

Examples of the laser include excimer lasers such as ArF lasers and KrF lasers, YAG lasers, $CO_2$ lasers and the like.

The laser irradiation energy is not particularly restricted and 1 to 10 mJ is preferable, while 5 to 7 mJ is particularly preferable. If the laser irradiation energy is within this range, it is possible to remove the constituent material of the optical waveguide layer 10 in a short time. The frequency when the laser is being irradiated is not particularly restricted and 50 to 300 Hz is preferable, while 200 to 250 Hz is particularly preferable. If the frequency is within this range, the smoothness of the inclined surface is particularly excellent.

Moreover, the size at which the laser is irradiated onto the optical waveguide layer 10 is not particularly restricted and depends on the size of the optical path changing portion being formed. However, the size is preferably 80 to 200 μm×80 to 200 μm, and particularly preferably 100 to 150 μm×100 to 150 μm. As a result, it is possible to form a detailed optical path changing portion.

(Receptor Structure Portion)

Next, a description of a method of forming a receptor structure portion will be described.

In this method of manufacturing a receptor structure portion, a mask in which an aperture portion is provided at a predetermined position where a receptor structure is to be formed is mounted, for example, on the optical waveguide layer 10 obtained in the manner described above so as to provide a through hole 13 for a receptor structure (i.e., the optical circuit substrate 15 (G1)). A conductive portion is worked in this receptor structure through hole 13 so as to match the desired receptor structure.

The size of the receptor structure through hole 13 should be large enough to enable an optical element to be mounted, and large enough to allow a conductive portion that is used to electrically connect the optical element and an electrical circuit, and may have, for example, a diameter of approximately 100 through 125 µm. The shape of the through hole is not particularly restricted and may be a circular column-shape or an angular column-shape.

Examples of the laser include a carbon gas laser, an excimer laser, and an ultraviolet laser. The method used to form the through hole may be the above described method using laser irradiation, however, any method may be used provided that it is appropriate for this manufacturing method. For example, methods such as dry etching using plasma and chemical etching and the like can be used.

When a conductive circuit is provided in the cladding layer of the optical circuit substrate, it is possible to form a conductive circuit in the optical waveguide layer 10 obtained in the manner described above, for example, by adhering a metal plate of copper or copper alloy or the like onto a cladding layer surface where the conductive circuit is to be provided, and by etching this metal plate. Moreover, it is also possible to form a conductive circuit by using an optical waveguide layer having an attached metal plate, and etching this metal plate.

Next, a description will be given of a method of forming a conductive circuit on an optical circuit substrate in which a conductive circuit is provided on an optical-element-mounting surface of an optical circuit substrate, and a conductive portion that penetrates the optical circuit substrate is formed on the conductive circuit in order to form a metal bond with the electrode of the electrical circuit substrate in order to achieve electrical conductivity between the conductive circuit and the electrical circuit substrate. In addition, a description will be given of a method of forming a conductive portion that penetrates the optical circuit substrate in order to achieve electrical conductivity on both surfaces of the optical circuit substrate.

Figure 3A:
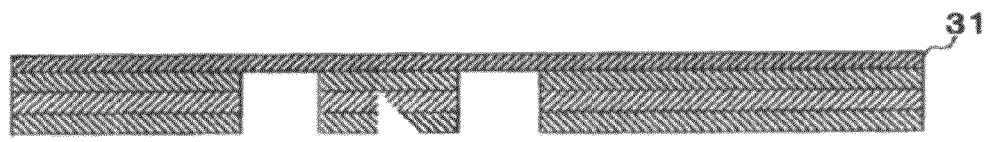
FIG. 3A is a cross-sectional view used to illustrate a step to adhere a metal plate in an example of a second optical circuit substrate (G2).

Firstly, a metal plate 31 is adhered (see FIG. 3A) onto the optical-element-mounting surface of the optical circuit substrate G1 (15) which was obtained in the manner described above. Next, a via hole (not shown) is formed on the metal plate 31 at a position where a conductive portion is formed that penetrates the optical waveguide layer 10 and forms a metal bond between the conductive circuit which is formed by the metal plate 31 and the electrode of the electrical circuit substrate.

Any method which is suitable for this manufacturing process may be used to form the via hole, and examples thereof include dry etching using lasers or plasma, chemical etching, and the like. Examples of a suitable laser include carbon gas lasers, excimer lasers, and ultraviolet ray lasers.

Figure 3B:
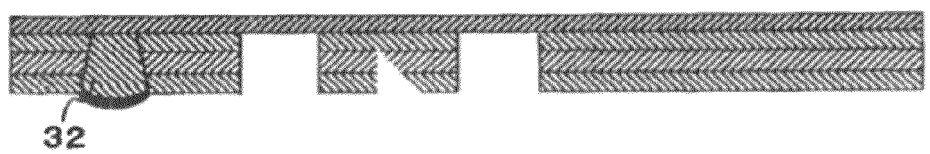
FIG. 3B is a cross-sectional view used to illustrate a step of forming a conductive post after the step shown in FIG. 3A.
Figure 3C:
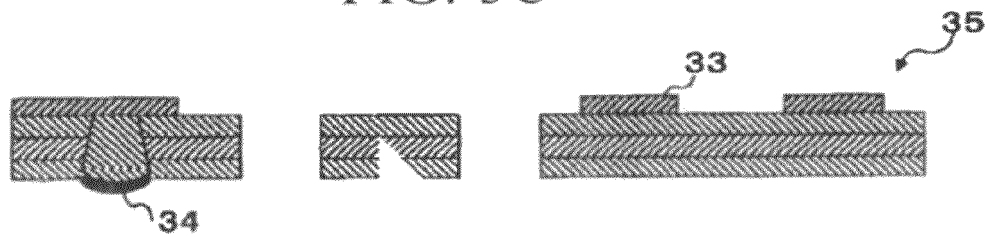
FIG. 3C is a cross-sectional view used to illustrate a step of forming a conductive circuit after the step shown in FIG. 3B.

Next, a conductive portion (i.e., a conductive post 32) is formed within the via hole by electroplating using the metal plate 31 as an electroplating lead (i.e., a power supply electrode) (see FIG. 3B), and the metal plate 31 is then etched so as to form a conductive circuit 33 (i.e., the optical circuit substrate G2 (35)) (see FIG. 3C).

At this time, it is preferable for a gold plating layer 34 to be formed by electroplating or the like (see FIG. 3C) on the bond portion between the conductive portion (i.e., the conductive post 32) of the optical circuit substrate and the electrode of the electrical circuit substrate, and it is also possible for the gold plating layer to be formed after nickel layer or the like has first been formed thereon by electroplating as a metal diffusion prevention layer. In the same way, it is also possible to form a solder film (i.e., a solder layer) by electroplating on the surface of the distal end of the conductive portion.

Examples of the method used to form the conductive portion (i.e., the conductive post 32) include electroless plating, printing a paste which contains copper, and the like. The conductive portion (i.e., the conductive post 32) may be a metal or an alloy of a metal, and examples of this metal include copper, solder, nickel, gold, tin, silver, and palladium. Among these, copper is preferable due to its low resistance. In order to improve the bondability of the conductive post (i.e., the conductive post 32), although this differs depending on the metal bonding method that is used, if soldering is used, it is also possible to form one layer of solder or one layer of solder and also one layer of copper on the conductive post. If a solder layer is formed on the conductive post, then it is not necessary to form the above described solder film.

Next, it is also possible for a conductive portion that provides a metal bond between the electrode of the optical element and the electrode of the electrical circuit substrate to be provided inside the receptor structure of the optical circuit substrate, and a description will now be given of a method of providing this conductive portion.

This conductive portion is formed by filling either part of or all of the receptor structure with a conductive material such as a conductive post from the bottom portion on the electrical circuit substrate side within the receptor structure.

Figure 4A:
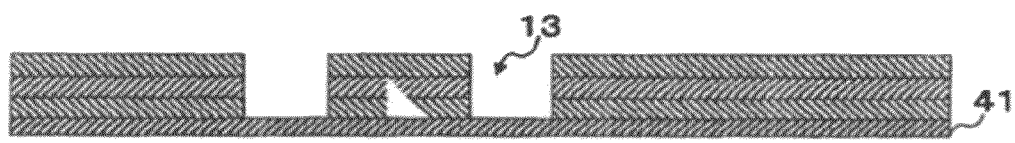
FIG. 4A is a cross-sectional view used to illustrate a step to adhere a metal plate in an example of a third optical circuit substrate (G3).

Firstly, the surface of the optical circuit substrate G1, which is obtained in the manner described above, that is in contact with the electrical circuit substrate is adhered to the metal plate 41 (FIG. 4A).

The material used to form the metal plate 41 is preferably one that can be ultimately removed by dry etching, and examples thereof include copper and copper alloys and the like.

At this time, it is also possible to use an optical waveguide layer to which a metal plate is already attached as the optical circuit substrate when the optical waveguide layer is being formed.

Normally, the thickness of the metal plate is preferably approximately 3 through 120 µm and more preferably approximately 5 through 70 µm.

Figure 4B:
FIG. 4B is a cross-sectional view used to illustrate a step of forming a conductive post after the step shown in FIG. 4A.

Next, using the metal plate 41 as an electroplating lead (i.e., as a power supply electrode), the conductive post 42 is formed by electroplating the receptor structure through hole 13 from the bottom surface on the conductive portion electrical circuit substrate side (see FIG. 4B). At this time, when mounting the optical element, if this optical element is being metal-bonded with a projecting portion provided on the electrode of the optical element, then in order to make this bonding easier, a portion is filled from the bottom so that there is sufficient thickness for the bonding.

Figure 4C:
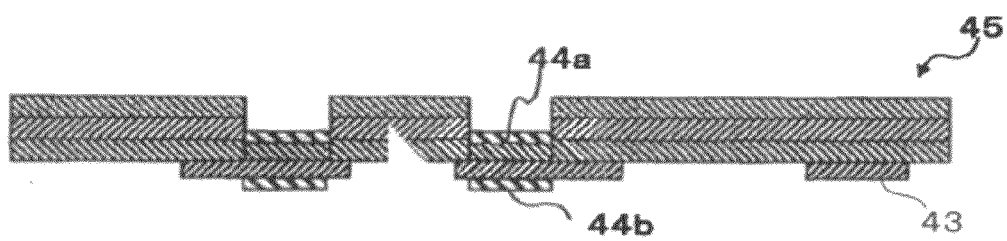
FIG. 4C is a cross-sectional view used to illustrate a step of forming a conductive circuit after the step shown in FIG. 4B.

Next, a conductive circuit 43 (i.e., an optical circuit substrate G3 (45)) is formed by etching the metal plate 41 (see FIG. 4C).

The conductive circuit 43 is formed such that, in the through hole 13 of the receptor structure, it covers at least a position (i.e., a bottom surface on the electrical circuit substrate side of the conductive portion) where an electrical connection is achieved with the electrode of the electrical circuit substrate. At this time, either all of the metal plate 41 may be removed by etching, or else it is also possible for the position (i.e., a bottom surface on the electrical circuit substrate side of the conductive portion) where an electrical connection is achieved with the electrode of the electrical circuit substrate to be removed.

In the optical circuit substrate G3 which is obtained in the manner described above, it is preferable for gold plating layers 44a and 44b to be formed by electroplating or the like (see FIG. 4C) on the bond portion of the optical circuit substrate with the electrode of the electrical circuit substrate on the electrical circuit, and on the bond portion between the conductive post 42 and the projection portion of the optical element, and it is also possible for the gold plating layers 44a and 44b to be formed after nickel layer or the like has first been formed thereon by electroplating as a metal diffusion prevention layer.

Figure 5A:
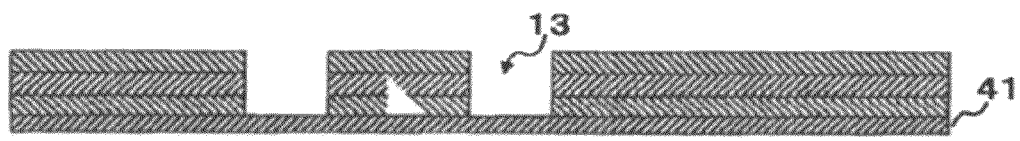
FIG. 5A is a cross-sectional view used to illustrate a step to adhere a metal plate in an example of a fourth optical circuit substrate (G4).
Figure 5B:
FIG. 5B is a cross-sectional view used to illustrate a step of forming a conductive post after the step shown in FIG. 5A.

When the projection portions are not provided on the electrode of the optical element, if there is a direct bond with the electrode of the optical element, then in the step in which the above described conductive post is formed by the bottom surface on the electrical circuit substrate side of the conductive portion, after the surface that is in contact with the optical circuit substrate obtained in the manner described above and the metal plate 41 have been adhered together (see FIG. 5A), the receptor structure through hole 13 can be filled with a conductive post 46 such that it protrudes from the optical-element-mounting surface of the optical circuit substrate (optical circuit substrate G4) (FIG. 5B).

Figure 5C:
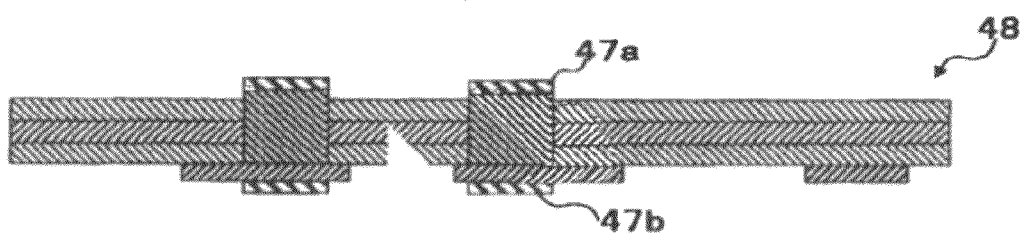
FIG. 5C is a cross-sectional view used to illustrate a step of forming a gold plating layer after the step shown in FIG. 5B.

In the above described step, it is preferable for gold plating layers 47a and 47b to be formed by electroplating or the like (see FIG. 5C) on the bond portion between the conductive post 46 and the projection portion of the optical element, and on the bond portion of the optical circuit substrate with the electrode of the electrical circuit substrate on the conductive circuit, and, if the conductive circuit is not provided, then also on the bond portion between the conductive post and the projection portion of the electrical circuit substrate. Alternatively, it is also possible for the gold plating layers 47a and 47b to be formed after nickel layer or the like has first been formed thereon by electroplating as a metal diffusion prevention layer. In the same way, it is also possible to form a solder film (i.e., a solder layer) by electroplating on the surface of the distal end of the conductive portion.

Examples of the method used to form the conductive posts 42 and 46 include electroless plating, printing a paste which contains copper, and the like in addition to electroplating. Forming copper posts by electroplating is extremely preferable as this allows the shape of the distal end of the copper posts to be freely controlled.

The conductive posts 42 and 46 may be formed from a metal or an alloy of a metal, and examples of this metal include copper, solder, nickel, gold, tin, silver, and palladium. Among these, copper is preferable due to its low resistance. In order to improve the bondability of the conductive posts 42 and 46, although this differs depending on the metal bonding method that is used, if soldering is used, it is also possible to form one layer of solder or one layer of solder and also one layer of copper on the conductive post. If a solder layer is formed on the conductive posts 42 and 46, then it is not necessary to form the above described solder film.

Inside the receptor structure described above, optical circuit substrates (i.e., the optical circuit substrates G3 and G4) that have conductive portions that are used to form a metal bond between an electrode of the optical element and an electrode of the electrical circuit substrate has a conductive circuit to be provided on an optical element mounting surface in the same way as the optical circuit substrate G2, and it is possible for a conductive portion that penetrates the optical circuit substrate to be formed on the conductive circuit in order to form a metal bond with the electrode of the electrical circuit substrate in order to achieve electrical conductivity between the conductive circuit and the electrical circuit substrate.

Next, the electrical circuit substrate will be described.

A mounting portion that is used to obtain electrical conductivity between an electrode of a mounted optical element and an electrode of an electrical circuit substrate is provided on the electrical circuit substrate of the present invention. Specific examples of the electrical circuit substrate include circuit substrates that have a non-conductive layer and a circuit layer, and a plurality of these layers may also be laminated together to form a multilayer circuit substrate. Moreover, a rigid circuit substrate or a flexible circuit substrate can be used. It is sufficient if at least the optical-element-mounting portion is provided on the electrical circuit substrate, however, it is also possible for electronic components to be mounted thereon.

Examples of the non-conductive layer include those that are formed from a resin composition of matter which uses a non-conductive resin such as cyanate resins, cyclic olefin resins, phenol resins, and epoxy resins. In particular, in order to reduce dimensional variations when an optical element is being mounted, resin compositions of matter that contain cyanate resins which have characteristics such as high heat resistance and a low coefficient of linear expansion and/or pre-polymers thereof, and also epoxy resins are preferably used.

Figure 6A:
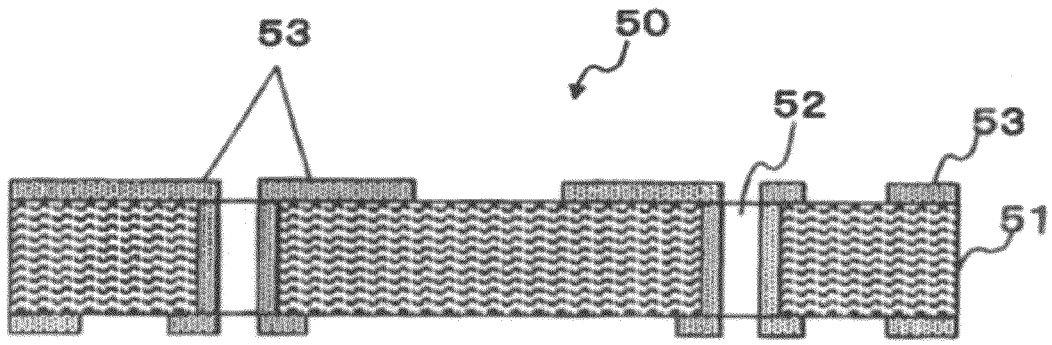
FIG. 6A is a cross-sectional view used to illustrate a step to form a conductive circuit in an example of an electrical circuit substrate.
Figure 6B:
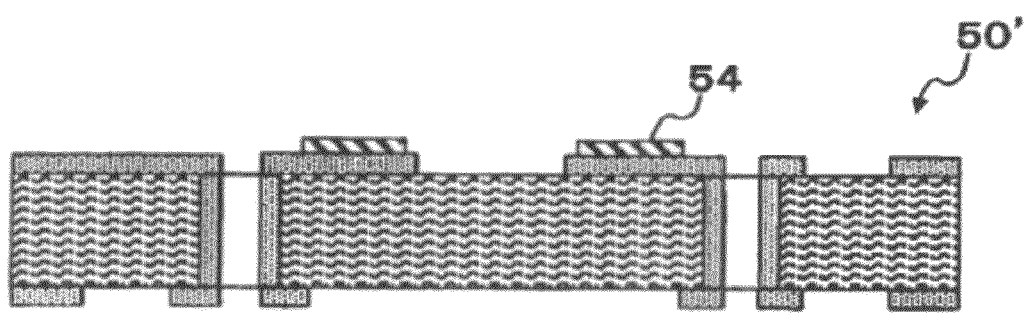
FIG. 6B is a cross-sectional view used to illustrate a step of forming a gold plating layer after the step shown in FIG. 6A.
Figure 6C:
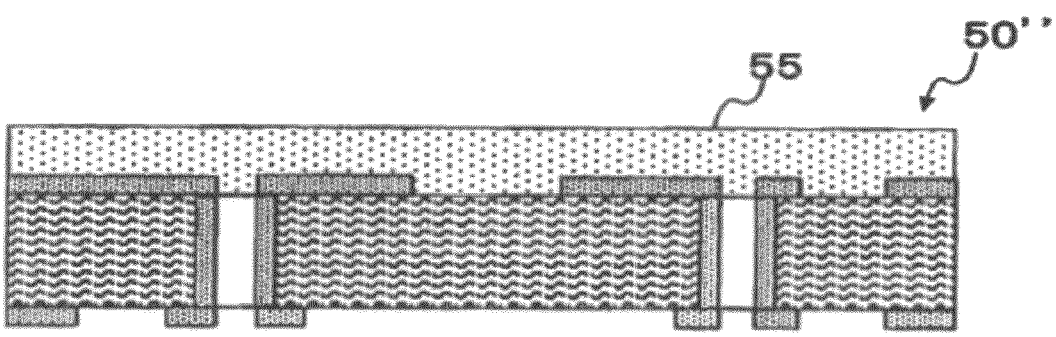
FIG. 6C is a cross-sectional view used to illustrate a step of forming an adhesive layer after the step shown in FIG. 6B.

FIGS. 6A to 6C are cross-sectional views showing an example of the electrical circuit substrate according to the present invention.

As is shown in FIG. 6A, in an electrical circuit substrate 50, an aperture portion 52 which is created by a drill is formed in a core substrate 51 having the above described non-conductive layer. In addition, conductive circuits 53 are formed on both surfaces of the core substrate 51.

At this time, lands are provided on the conductive circuits 53 that form mounting portions for obtaining electrical conductivity between the electrode of the optical element and the electrode of the electrical circuit substrate when an optical element is mounted thereon. When an optical element is mounted via an optical circuit on both surfaces of the electrical circuit substrate, it is sufficient for these lands to be provided on conductive circuits on both surfaces of the electrical circuit substrate.

Electroplating is provided inside the aperture portion 52, and the conductive circuits 53 on the two surfaces of the core substrate 51 are mutually conductive.

A method of manufacturing this type of wiring board will now be described using FIGS. 6A to 6C. The aperture portion 52 is first formed by a drill, for example, in the core substrate 51 (for example, a double-sided copper foil FR-4). Next, plating processing is performed on the aperture portion 52 by electroless plating, so as to achieve conductivity between both surfaces of the core substrate 51. By then etching this copper foil, the conductive circuits 53 which include lands which form mounting portions for obtaining electrical conductivity between the electrode of the optical element and the electrode of the electrical circuit substrate are formed (see FIG. 6A).

It is preferable for a gold plating layer 54 to be formed by electroplating or the like on the surface of the lands (see FIG. 6B), and it is also possible for the gold plating layer to be formed after nickel layer or the like has first been formed thereon by electroplating as a metal diffusion prevention layer.

Any material which is suitable for this manufacturing method may be used for the conductive circuit 53, however it is preferable that the material can be removed by a method such as etching or peeling when the conductive circuit is being formed, and a material which is able to withstand the chemical solutions used for this etching is preferable. Examples of such a material that can be used for the conductive circuits 53 include copper, copper alloys, 42 alloy, and nickel and the like. In particular, copper foil, copper plate, and copper alloy plate are most preferably used for the conductive circuits 53 in that not only do they allow electroplated items and rolled items to be chosen, but they can be obtained in various thicknesses.

Moreover, on the electrical circuit substrate obtained in the manner described above, it is also possible to provide an adhesive layer that is used to provide a metal bond for mounting the optical element on the optical circuit substrate on one surface or both surfaces of the core substrate 51 so as to cover the conductive circuit 53, or to provide adhesion between the optical circuit substrate and the electrical circuit substrate. In this case, the adhesive layer 55 is formed so as to cover the conductive circuit 53 (see FIG. 6C).

Examples of the method that may be employed to form the adhesive layer 55 include a method in which a resin composition of matter which will form the adhesive layer is coated directly onto an adhesive layer formation surface, a method in which a carrier material with an attached adhesive layer is pressed, and a method in which a carrier material having an attached adhesive material is laminated using a vacuum press, a laminator, a vacuum laminator, or a becquerel type lamination apparatus or the like so as to form an adhesive layer.

When a metal layer is used as the carrier material for the adhesive layer, it is possible to work the metal layer as a conductive circuit.

When solder or the like is used to achieve bonding in the metal bonding of the electrode of the electrical circuit substrate with the electrode of the optical element when the optical element is being mounted, or in the metal bonding of the conductive post provided inside the receptor structure, then it is preferable for the adhesive layer 55 to use an adhesive agent that contains a thermosetting flux which acts as a flux during the solder bonding operation. Examples thereof include materials that contain a resin (A) having a phenolic hydroxide base, and a resin (B) which is a curing agent for the resin (A).

As the resin (A) having a phenolic hydroxide base, it is preferable to use, for example, novolac phenol resins such as phenol novolac resin, alkyl phenol novolac resin, and multivalent phenol novolac resin, resol phenol resins, polyvinyl phenol resins and the like. Among these, because multivalent phenol novolac resins have two or more phenolic hydroxyl bases in a single benzene ring, compared to mono functional phenol novolac resins, they have much more rapidly improving properties as the flux of a solder bond. Moreover, because dihydroxybenzoic acids such as 2,4-dihydroxybenzoic acid, and 2,5-dihydroxybenzoic acid, hydroxyl naphthoic acid such as 1-hydroxy-2-naphthoic acid and 2-hydroxy-3-naphthoic acid, phenolphthalein, hydroxybenzoic acid, hydroxyphenylacetic acid, 4-hydroxy-3-methoxy benzoic acid, diphenolic acid, 4-hydroxy-3-nitrobenzoic acid and the like have a carboxyl base within the molecule, there is an improved action when removing contamination such as solder and oxides on the metal surface, and this is favorable for obtaining a stable solder bond. Among these, dihydroxybenzoic acids and phenolphthalein are more preferable.

As the resin (B) which acts as a curing agent for the resin having the phenolic hydroxide base, specifically, epoxy resins such as bisphenol A epoxy resin, bisphenol F epoxy resin, phenol novolac epoxy resin groups, cresol novolac epoxy resins, alkyl phenol novolac epoxy resin groups, biphenol epoxy resin groups, naphthol epoxy resins and resorcinol epoxy resins, and dicyclopentadiene epoxy resins, as well as isocyanate resins and cyanate resins that have the same framework as the aforementioned resins. Further examples of the resin (B) include denatured epoxy compounds and isocyanate compounds which have the framework of an aliphatic group, a cyclic aliphatic group, or an unsaturated aliphatic group as a base. Silicon denatured epoxy resin is one example of such a compound.

In addition to the above described components, it is also possible for the adhesive agent to additionally contain other resins such as cyclic olefin resins and the like, and also various other additives and solvents such as inorganic filling materials, curing catalysts, coloring agents, anti-foaming agents, coupling agents and the like.

When the adhesive agent that contains thermosetting flux is in sheet form, then in order to improve the properties of this sheet, it is also possible to use a thermoplastic resin insofar as the above described characteristics are not impeded. Examples of this thermoplastic resin include phenoxy resin, polyvinyl butyral resin, polyester resins, polyurethane resins, polyimide siloxane resin, polypropylene, styrene-butadiene-styrene copolymers, polyacetal resin, polyamide resin, acrylonitrile-butadiene copolymers, acrylonitrile-butadiene-methacrylate copolymers, acrylonitrile-butadiene-styrene copolymers, polyvinyl acetate resin, nylon, styrene-isoprene copolymers, styrene-butylene-styrene block copolymers, styrene-ethylene-butylene-styrene block copolymers, and polymethyl methacrylate resin and the like.

Various aspects of the optical circuit substrate and the electrical circuit substrate that constitute the optical-element-mounting substrate (i.e., the substrate on which an optical element is mounted) have been described above, however, next, a detailed description will be given of specific aspects (i.e., a first through fourth aspect) of the optical-element-mounting substrate with reference made to the drawings.

Figure 7A:
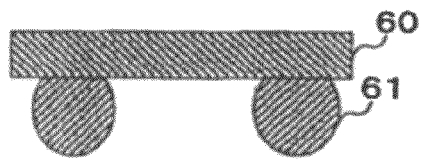
FIG. 7A is a cross-sectional view used to illustrate an optical element in a first aspect of the substrate on which an optical element is mounted (G1).
Figure 7B:
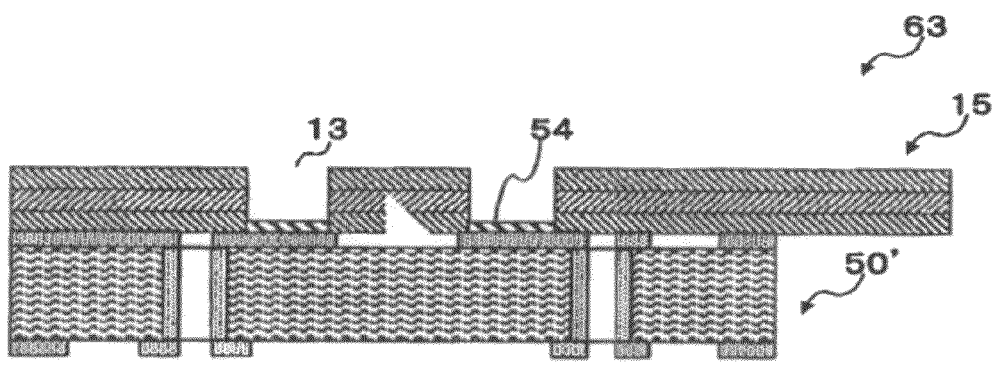
FIG. 7B is a cross-sectional view used to illustrate a substrate for mounting an optical element according to the first aspect.

[First Aspect (FIG. 7D)]

Figure 7C:
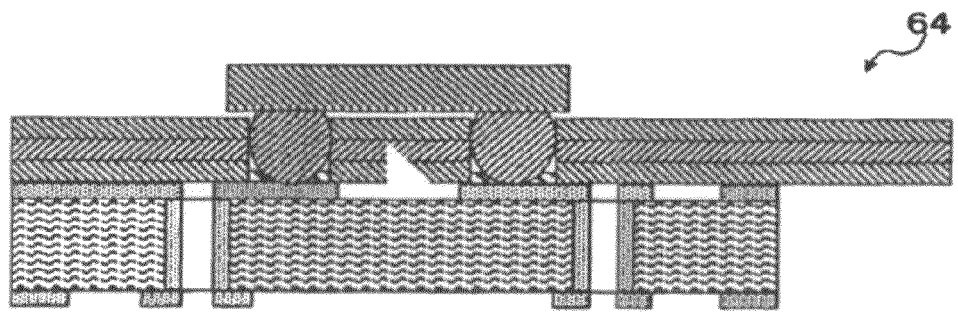
FIG. 7C is a typical view used to illustrate a substrate on which an optical element is mounted according to the first aspect.
Figure 7D:
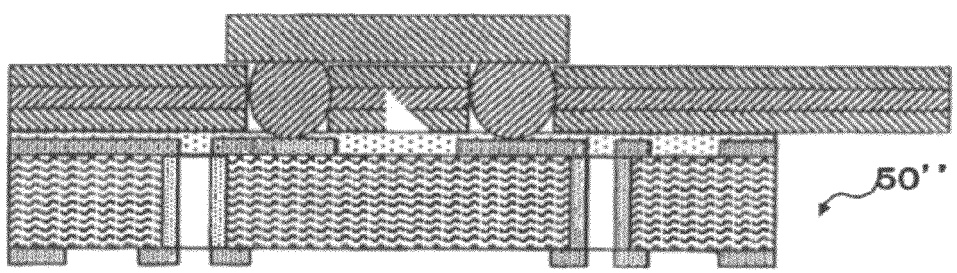
FIG. 7D is a typical view used to illustrate a variant example in which an adhesive layer is provided according to the first aspect.

As is shown in FIG. 7C, the electrode of the optical element and the electrode of the electrical circuit substrate, which are mounted via the optical circuit substrate, are directly metal-bonded onto the optical-element-mounting portion of the electrical circuit substrate of a substrate for mounting an optical element that is formed by an electrical circuit substrate on which is provided an optical-element-mounting portion that is used for mounting an optical element, and by an optical circuit substrate that is formed by an optical waveguide layer having a core portion and cladding portions and that is provided with a receptor structure that is used to obtain electrical conduction between the electrode of the optical element and the electrode of the electrical circuit substrate, with a metal projection portion which is provided on the electrode of the optical element used as a conductive portion inside the receptor structure.

An optical element 60 that is used in this first aspect has metal projection portions (bumps) 61 which form conductive portions inside receptor structures on top of the electrode of the optical element 60 (see FIG. 7A). Examples of the material used to form the metal projection portions 61 include gold, copper, and solder and the like, and the material may be selected depending on the metal bonding method. If the metal bonding is to be achieved through ultrasonic wave bonding, then gold or copper are preferable.

A specific of the optical element 60 will be described with reference made to FIGS. 12A through 12D. For example, in an optical element having a single light receiving point or light emitting point, then on the light receiving/emitting point 62 side, there are provided a metal projection portion 61a that is provided on a signal wire connection electrode, a metal projection portion 61b that is provided on a ground wire connection electrode, and a position fixing metal projection portion 61c (see FIGS. 12A through 12C). By providing one position fixing projection portion, the optical element can be reliably fixed in position, but it is also possible for a plurality of these to be provided. It is also possible for the optical element to have a plurality of light receiving points or light emitting points, and it is also possible, for example, for four of the above described optical element which has a single light receiving point or light emitting point to be arranged in a row (see FIG. 2D). Optical elements that have a plurality of light receiving points or light emitting points are used for optical circuit substrates that have a plurality of core portions, and the number of light receiving points or light emitting points can be decided in accordance with the number of core portions.

The size of the metal projection portions should be sufficient to allow them to be housed within the receptor structure through hole, while enabling them to obtain a satisfactory metal bond with the electrode of the electrical circuit.

Next, an example of a first aspect of the manufacturing method will be described.

Firstly, the optical circuit substrate (G1) 15 obtained in the manner described above, and the electrical circuit substrate 50' which had the gold plating layer 54 formed on the lands thereof were prepared, the positions of each were then fixed and the two were stacked together so as to form the substrate for mounting an optical element (G1) 63 (see FIG. 7B).

In this positioning, passive alignment can be performed in which the light receiving optical elements are mounted along the receptor structure through holes. As a result, improvements in both the mounting accuracy and mounting speed can be achieved.

Next, the metal projection portion 61 which was formed on the optical element 60 having the metal projections portions was positioned in the receptor structure through hole 13 which was formed in the optical circuit substrate (G1) 15 on the substrate for mounting an optical element (G1) 63, so as to be housed in a predetermined position. A load was then applied such that the metal projection portion 61 was pressed against the gold plating layer 54, and at the same time, ultrasonic wave bonding was conducted enabling a substrate on which an optical element is mounted (G1) 64 on which an optical element is mounted to be obtained (see FIG. 7C).

Specific examples of the ultrasonic bonding method include, firstly, housing the metal projection portion 61 in the receptor structure through hole 13, and thereafter, using an ultrasonic bonding apparatus, to apply a load, generally, of approximately 1 kN, at a frequency of 15 kHz, and a rated power of 3000 W. The metal projection portion 61 is then bonded by being vibrated for 0.5 seconds while being pressed against the gold plating layer 54.

In the above described first aspect, when the substrate for mounting an optical element is being manufactured by mutually superimposing an optical circuit substrate and an electrical circuit substrate, it is also possible for these two substrates to be adhered together by means of an adhesive agent. In this case, an electrical circuit substrate 50" having an adhesive layer 55 such as is shown in FIG. 6C is prepared, and can be then adhered together with the optical circuit substrate (see FIG. 7D). Moreover, if metal bonding using a solder bond is performed for the above described metal bond instead of ultrasonic bonding, then by using an adhesive agent that contains a thermosetting flux to act as the flux on the adhesive layer 55, it is possible to form a bond by applying heat to a temperature where the solder melts. In this case, it is preferable for the conductive portion where the metal bonding is performed to be made from a metal which includes solder. It is also possible for an adhesive agent to be used in the same way in the other aspects described below.

Figure 8A:
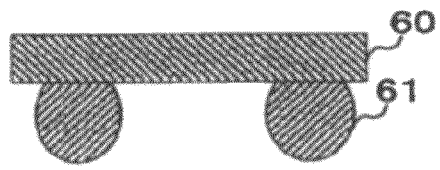
FIG. 8A is a cross-sectional view used to illustrate an optical element in a second aspect of the substrate on which an optical element is mounted (G2).
Figure 8B:
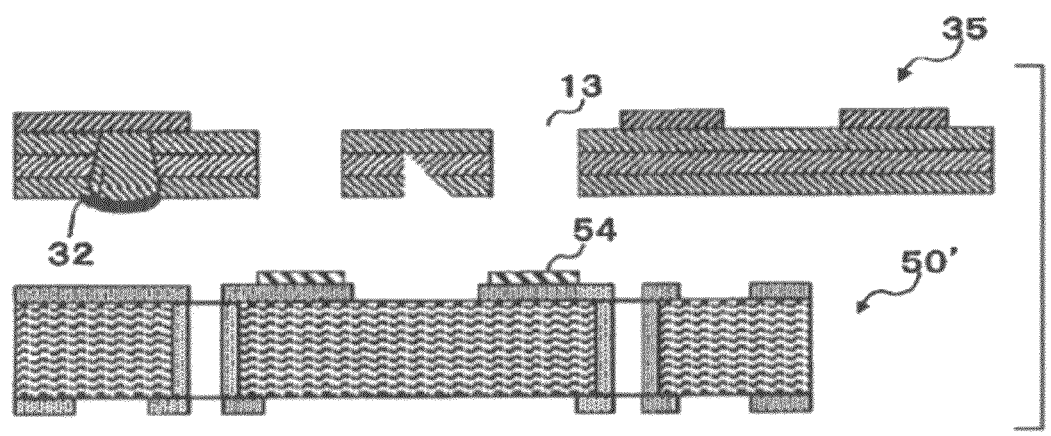
FIG. 8B is a cross-sectional view used to illustrate an optical circuit substrate and an electrical circuit substrate according to the second aspect.

[Second Aspect (FIG. 8D)]

Figure 8C:
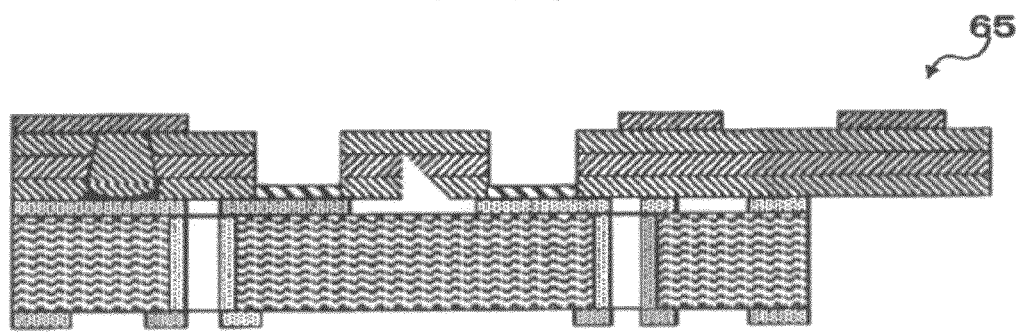
FIG. 8C is a cross-sectional view used to illustrate a substrate for mounting an optical element according to the second aspect.
Figure 8D:
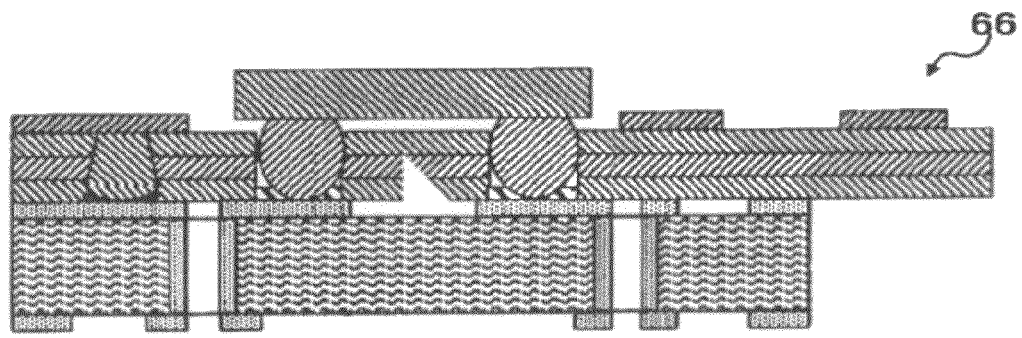
FIG. 8D is a typical view used to illustrate a substrate on which an optical element is mounted according to the second aspect.

As is shown in FIG. 8C, in the first aspect, the optical circuit substrate (G2) 35 is used in which the optical circuit substrate has a conductive path on the optical-element-mounting surface, and in which a conductive portion that penetrates the optical circuit substrate is formed on the conductive circuit in order to form a metal bond with the electrode of the electrical circuit substrate in order to achieve electrical conductivity between the conductive circuit and the electrical circuit substrate. In the first aspect, the electrode of the optical element and the electrode of the electrical circuit substrate are directly metal-bonded with the metal projection portion provided on the electrode of the optical element used as the conductive portion inside the receptor structure, and the conductive portion that penetrates the optical circuit substrate above the conductive circuit that is formed on the optical-element-mounting surface, and that is used to form a metal bond together with the electrode of the electrical circuit substrate is metal-bonded together with the electrode of the electrical circuit substrate with which it corresponds.

In the same way as the optical element 60 used in the first aspect, the optical element 60 that is used in this second aspect has metal projection portions (bumps) 61 which form conductive portions inside receptor structures (see FIG. 8A).

Next, an example of the manufacturing method according to the second aspect will be described.

Firstly, the optical circuit substrate (G2) 35 obtained in the manner described above, and the electrical circuit substrate 50' which had the gold plating layer 54 formed on the lands thereof which are used for mounting an optical element were prepared (see FIG. 8B). The receptor structure through holes 13 which are formed in the optical circuit substrate (G2) 35 were then positioned relative to the gold plating layers 54 on the lands, and the conductive post 32 which penetrates the optical circuit substrate and serves as a conductive portion for forming a metal bond with the electrode of the electrical circuit substrate was positioned relative to the electrode (not shown) of the electrical circuit substrate with which it corresponds. The two were then superimposed at the same time as a load was applied, and ultrasonic wave bonding was conducted so that the conductive post 32 which penetrates the optical circuit substrate and is used to form a metal bond with the electrode of the electrical circuit substrate and the electrode of the electrical circuit substrate with which it corresponds were metal-bonded together, thereby enabling a substrate on which an optical element is mounted (G2) 65 to be obtained (see FIG. 8C).

Next, the metal projection portion 61 of the optical element 60 having the metal projections portions was positioned relative to the receptor structure through hole 13 which was formed on the substrate for mounting an optical element (G2) 65, so as to be housed in a predetermined position. A load was then applied such that the metal projection portion 61 was pressed against the gold plating layer 54, and at the same time, ultrasonic wave bonding was conducted enabling a substrate on which an optical element is mounted 66 on which an optical element is mounted to be obtained (see FIG. 8D).

At this time, the conditions for the load and the ultrasonic wave bonding were the same as those of the first aspect.

Note that in the above description, a method is described in which the optical element is mounted after a conductive portion which penetrates the optical circuit substrate and is metal-bonded with the electrode of the electrical circuit substrate is metal-bonded with the electrode of the electrical circuit substrate with which it corresponds so as to form the substrate for mounting an optical element (G2) 65, however, it is also possible for the positioning of the conductive post 32 which penetrates the optical circuit substrate and is metal-bonded with the electrode of the electrical circuit substrate relative to the electrode of the electrical circuit substrate with which it corresponds to be performed at the same time as the positioning of the metal projection portion 61 of the optical element 60 having the metal projections portions relative to the receptor structure through hole 13 which is formed on the substrate for mounting an optical element (G2) 65 such that it is housed in a predetermined position, and for the entire metal bonding to be performed by means of ultrasonic wave bonding in a single operation.

Moreover, in the above described second aspect, in the same way as in the first aspect, when the substrate for mounting an optical element is being manufactured by mutually superimposing an optical circuit substrate and an electrical circuit substrate, it is also possible for these two substrates to be adhered together by means of an adhesive agent.

Figure 9A:
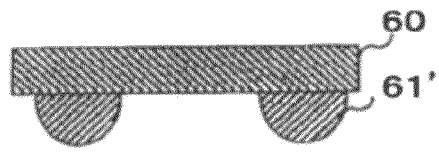
FIG. 9A is a cross-sectional view used to illustrate an optical element in a third aspect of the substrate on which an optical element is mounted (G3).
Figure 9B:
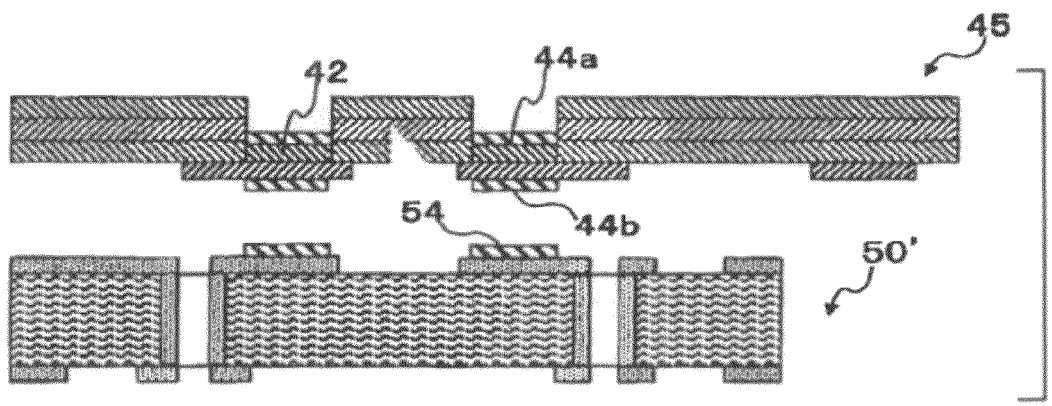
FIG. 9B is a cross-sectional view used to illustrate an optical circuit substrate and an electrical circuit substrate according to the third aspect.

[Third Aspect (FIG. 9D)]

Figure 9C:
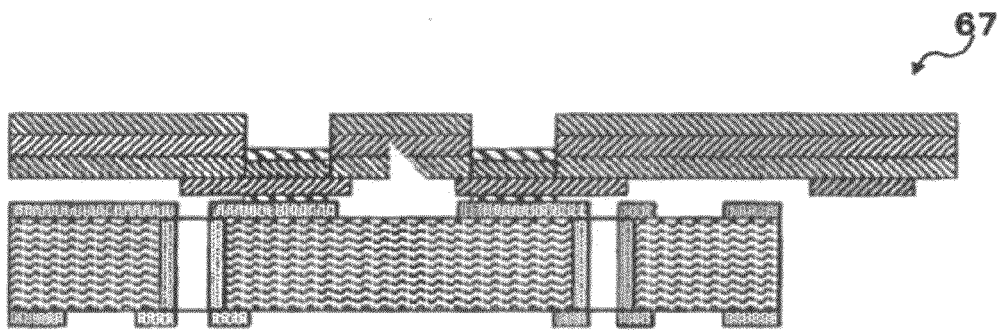
FIG. 9C is a cross-sectional view used to illustrate a substrate for mounting an optical element according to the third aspect.
Figure 9D:
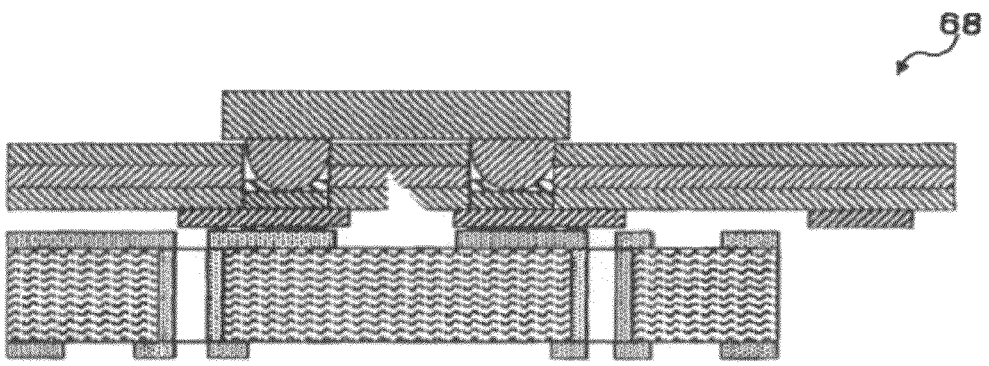
FIG. 9D is a typical view used to illustrate a substrate on which an optical element is mounted according to the third aspect.

As is shown in FIG. 9C, the electrode of the optical element and the electrode of the electrical circuit substrate, which are mounted via the optical circuit substrate, are directly metal-bonded onto the optical-element-mounting portion on the electrical circuit substrate of a substrate for mounting an optical element that is formed by an electrical circuit substrate on which is provided an optical-element-mounting portion that is used for mounting an optical element, and by an optical circuit substrate that is formed by an optical waveguide layer having a core portion and cladding portions and that is provided with a receptor structure that is used to obtain electrical conduction between the electrode of the optical element and the electrode of the electrical circuit substrate, so as to contain a conductive post which is formed inside the receptor structure as a conductive portion inside the receptor structure. In the third aspect, the conductive post 42 is partially formed by the bottom surface on the conductive portion electrical circuit substrate side, and the conductive portion inside the receptor structure is formed by the partially provided conductive post 42 and by a metal projection portion 61' which is provided on the electrode of the optical element. As a result, because it is possible to ensure a sufficient height for the conductive portion, the metal bondability is further improved.

An optical element having the same structure as the optical element that was used in the first aspect can be used for the optical element 60 that is used in the third aspect, and it is sufficient if the metal projection portions (bumps) 61 which are formed on the optical element electrode have enough height to ensure sufficient metal bondability as conductive portions inside the receptor structure (see FIG. 9A).

Next, an example of the manufacturing method according to the third aspect will be described.

Firstly, the optical circuit substrate (G3) 45 obtained in the manner described above, and the electrical circuit substrate 50' which had the gold plating layer 54 formed on the lands thereof which are used for mounting an optical element were prepared (see FIG. 9B). The portions (i.e., the gold plating layer 44b) that are metal-bonded with the electrical circuit substrate on the conductive post 42 in the receptor structure formed in the optical circuit substrate (G3) 45 were then positioned relative to the gold plating layers 54 on the lands. At the same time as a load was then applied such that the metal-bonded portions (i.e., the gold plating layer 44b) in the receptor structure were pressed against the gold plating layer 54, ultrasonic wave bonding was conducted thereby enabling a substrate for mounting an optical element (G3) 67 to be obtained (see FIG. 9C).

Next, the metal projection portion 61' of the optical element 60 having the metal projections portions was positioned relative to the conductive post 42 (i.e., the gold plating layer 44b) in the receptor structure formed in the substrate for mounting an optical element (G3) 67, so as to be housed in a predetermined position. A load was then applied such that the metal projection portion 61' was pressed against the gold plating layer 44a, and at the same time, ultrasonic wave bonding was conducted enabling a substrate on which an optical element is mounted (G3) 68 on which an optical element is mounted to be obtained (see FIG. 9D).

At this time, the conditions for the load and the ultrasonic wave bonding were the same as those of the first aspect.

Note that in the above description, a method is described in which the optical element is mounted after the optical circuit substrate is metal-bonded with the electrode of the electrical circuit substrate so as to form the substrate for mounting an optical element (G3) 67, however, it is also possible for the optical circuit substrate, the electrical circuit substrate, and the optical element to be positioned simultaneously, and for the entire metal bonding to be performed by means of ultrasonic wave bonding in a single operation.

Moreover, in the above described third aspect, in the same way as in the first aspect, when the substrate for mounting an optical element is being manufactured by mutually superimposing an optical circuit substrate and an electrical circuit substrate, it is also possible for these two substrates to be adhered together by means of an adhesive agent.

Figure 10A:
FIG. 10A is a cross-sectional view used to illustrate an optical element in a fourth aspect of the substrate on which an optical element is mounted (G4).
Figure 10B:
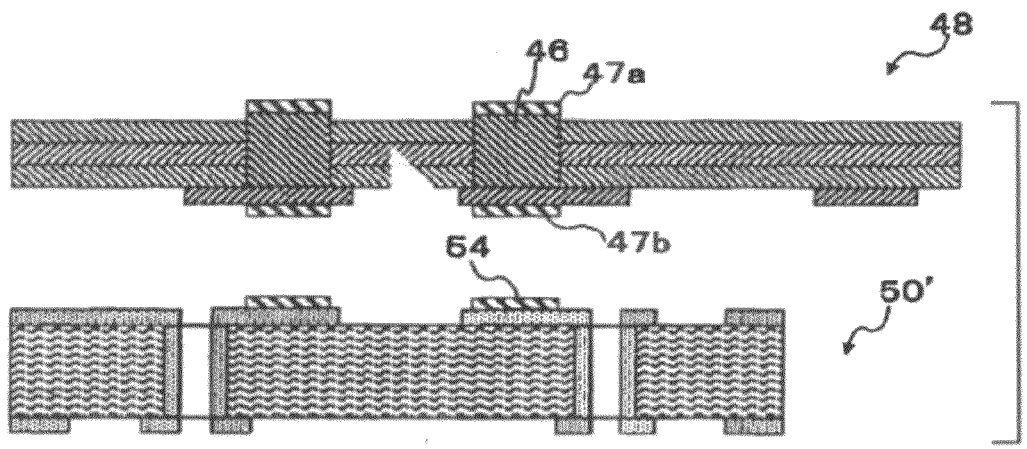
FIG. 10B is a cross-sectional view used to illustrate an optical circuit substrate and an electrical circuit substrate according to the fourth aspect.

[Fourth Aspect (FIG. 10D)]

Figure 10C:
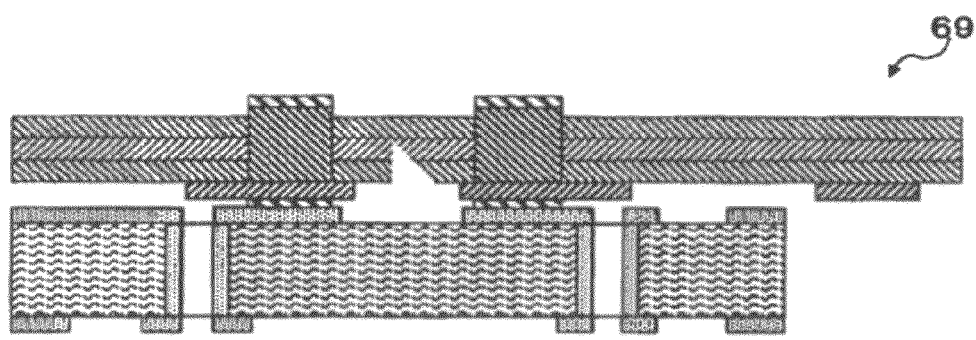
FIG. 10C is a cross-sectional view used to illustrate a substrate for mounting an optical element according to the fourth aspect.
Figure 10D:
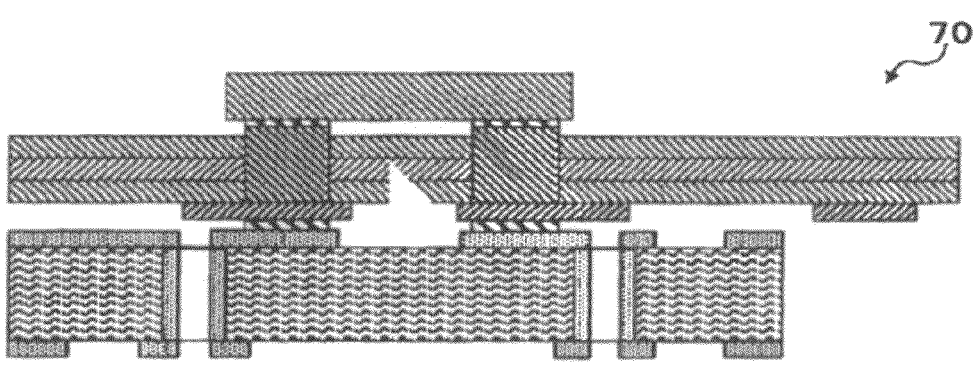
FIG. 10D is a cross-sectional view used to illustrate a substrate on which an optical element is mounted according to the fourth aspect.

As is shown in FIG. 10C, the electrode of the optical element and the electrode of the electrical circuit substrate, which are mounted via the optical circuit substrate, are directly metal-bonded onto the optical-element-mounting portion on the electrical circuit substrate of a substrate for mounting an optical element that is formed by an electrical circuit substrate on which is provided an optical-element-mounting portion that is used for mounting an optical element, and by an optical circuit substrate that is formed by an optical waveguide layer having a core portion and cladding portions and that is provided with a receptor structure that is used to obtain electrical conduction between the electrode of the optical element and the electrode of the electrical circuit substrate, by means of a conductive post that is formed within the receptor structure and protrudes beyond the optical-element-mounting surface of the optical circuit substrate, so as to form a conductive portion inside the receptor structure. In the fourth aspect, the conductive post 46 is completely formed by the bottom surface on the conductive portion electrical circuit substrate side, and, furthermore, it is possible to improve the metal bondability, and it is also not necessary for a metal projection portion to be provided on the electrode of the optical element.

In the optical element 60 used in the fourth aspect, as is described in the aspect, it is not necessary to form the metal projection portion on the electrode and it is sufficient if there is provided an electrode for making an electrical connection.

Next, an example of the manufacturing method according to the fourth aspect will be described.

Firstly, the optical circuit substrate (G4) 48 obtained in the manner described above, and the electrical circuit substrate 50' which had the gold plating layer 54 formed on the lands thereof which are used for mounting an optical element were prepared (see FIG. 10B). The portions (i.e., the gold plating layer 47b) that are metal-bonded with the electrical circuit substrate on the conductive post 46 in the receptor structure formed in the optical circuit substrate (G4) 48 were then positioned relative to the gold plating layers 54 on the lands. At the same time as a load was then applied such that the metal-bonded portions (i.e., the gold plating layer 47b) in the receptor structure were pressed against the gold plating layer 54, ultrasonic wave bonding was conducted thereby enabling a substrate for mounting an optical element (G4) 69 to be obtained (see FIG. 10C).

Next, the electrode of the optical element 60 was positioned on the gold plating layer 47a on the conductive post 46 which is protruding from the receptor structure formed in the substrate for mounting an optical element (G4) 69. A load was then applied such that the electrode of the optical element 60 was pressed against the gold plating layer 47a of the conductive post 46 protruding from the receptor structure, and at the same time, ultrasonic wave bonding was conducted enabling a substrate on which an optical element is mounted (G4) 70 on which an optical element is mounted to be obtained (see FIG. 10D).

At this time, the conditions for the load and the ultrasonic wave bonding were the same as those of the first aspect. Moreover, the gold plating layer 47a of the conductive post 46 protruding from the receptor structure may be formed on the electrode of the optical element.

Note that in the above description, a method is described in which the optical element is mounted after the optical circuit substrate is metal-bonded with the electrode of the electrical circuit substrate so as to form the substrate for mounting an optical element (G4) 69, however, it is also possible for the optical circuit substrate, the electrical circuit substrate, and the optical element to be positioned simultaneously, and for the entire metal bonding to be performed by means of ultrasonic wave bonding in a single operation.

Moreover, in the above described fourth aspect, in the same way as in the first aspect, when the substrate for mounting an optical element is being manufactured by mutually superimposing an optical circuit substrate and an electrical circuit substrate, it is also possible for these two substrates to be adhered together by means of an adhesive agent.

Furthermore, in the above described aspect, a description is given of a structure in which an optical element is mounted on a substrate for mounting an optical element that is formed by the optical circuit substrate and the electrical circuit substrate, and of a method of manufacturing the same, however, it is also possible, for example, to also form the receptor structure in the other end portion from the end portion where the receptor structure is formed, and to then form the electrical circuit substrate and the substrate for mounting an optical element and form the optical circuit substrate like a suspension bridge so that the optical element can be mounted thereon. In this case, the receptor structures and the electrical circuit substrates that are formed at both ends of the optical circuit substrate may also have mutually different structures.

Figure 11:
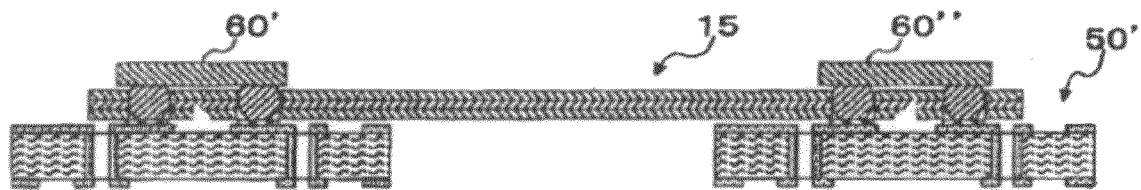
FIG. 11 is a typical view showing another aspect of a substrate on which an optical element is mounted.
Figure 12A:
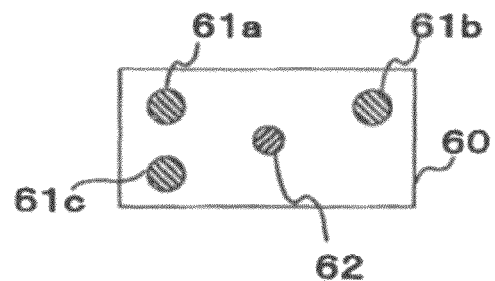
FIG. 12A is a plan view showing an example of an optical element.
Figure 12B:
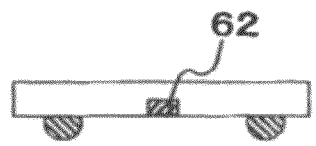
FIG. 12B is a side view of the optical element shown in FIG. 12A.
Figure 12C:
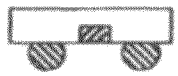
FIG. 12C is a left side view of the optical element shown in FIG. 12A.
Figure 12D:
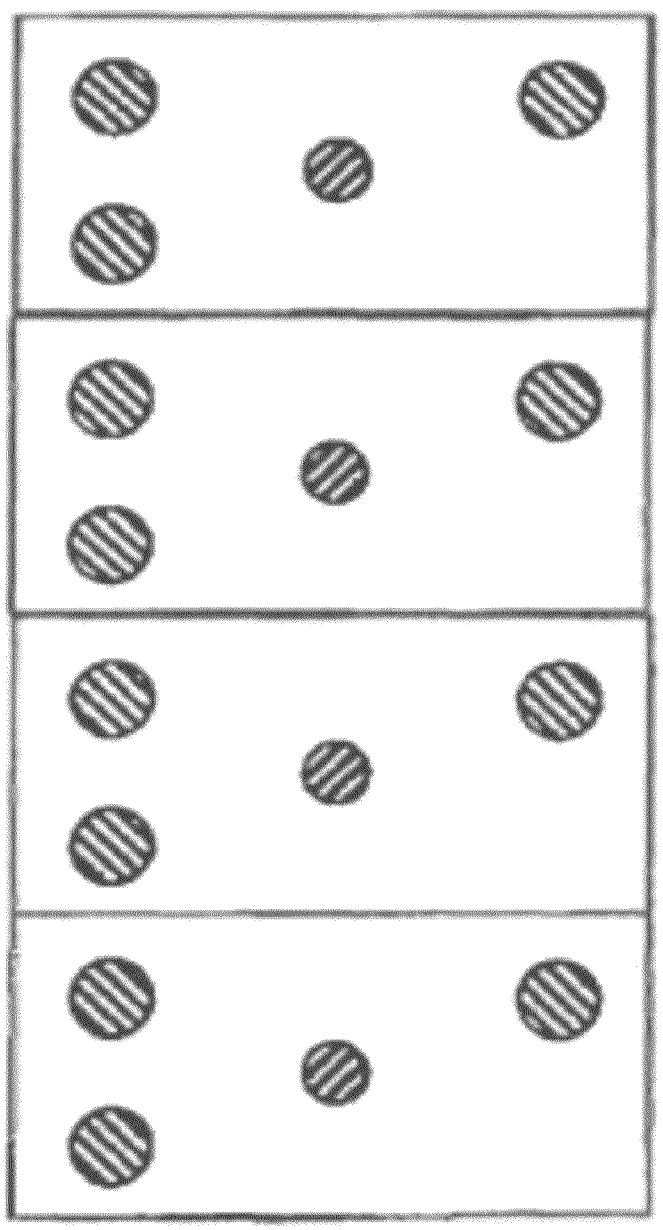
FIG. 12D is a plan view showing another example of an optical element.

As can be seen from FIG. 11, in an optical element packaged substrate obtained in this manner, for example, in the case of the substrate on which an optical element is mounted (G1), an optical element 60' having a light emitting point may be mounted on the optical-element-mounting portion of the electrical circuit substrate 50' in the receptor structure formed at one end of the optical circuit substrate (G1) 15, and an optical element 60" having a light receiving point may be mounted on the optical-element-mounting portion of the electrical circuit substrate 50' in the receptor structure formed at the other end spanning across the circuit substrate (G1) 15. In the other aspects as well, this bridging structure can also be used in the same way. It is also possible for electronic components to be mounted on the electrical circuit substrate 50'.

Furthermore, in the above described aspect, an optical element can be mounted via the optical circuit substrate on both surfaces of the electrical circuit substrate.

The invention claimed is:

1. A substrate on which an optical element is mounted, comprising:
an electrical circuit substrate having an electrical circuit;
an optical circuit substrate mounted over the electrical circuit substrate and comprising an optical waveguide layer having a core portion and cladding portions; and
an optical element mounted over the electrical circuit substrate and the optical circuit substrate,
wherein the optical circuit substrate has a through hole in which a receptor structure having a conductive portion is provided, the conductive portion of the receptor structure is electrically connecting an electrode of the optical element and an electrode of the electrical circuit of the electrical circuit substrate, and the optical circuit substrate has a via hole penetrating through the optical circuit substrate and a conductive post formed in the via hole and electrically connected to the electrical circuit of the electrical circuit substrate.

2. The substrate on which an optical element is mounted according to claim 1, wherein, in the receptor structure, the electrode of the optical element and the electrode of the electrical circuit substrate are metal-bonded by the conductive portion inside the receptor structure.

3. The substrate on which an optical element is mounted according to claim 1, wherein the conductive portion in the receptor structure comprises a projection portion which is provided on the electrode of the optical element.

4. The substrate on which an optical element is mounted according to claim 1, wherein, in the conductive portion in the receptor structure, a conductive post which is protruding beyond an optical-element-mounting surface of the optical circuit substrate is metal-bonded to the electrode of the optical element.

5. The substrate on which an optical element is mounted according to claim 1, wherein the conductive portion in the receptor structure comprises a conductive post and a projection portion which is provided on the electrode of the optical element and the conductive post.

6. The substrate on which an optical element is mounted according to claim 1, wherein the optical circuit substrate has a conductive circuit on the optical waveguide layer.

7. The substrate on which an optical element is mounted according to claim 1, wherein the optical circuit substrate has a conductive circuit, the conductive portion in the receptor structure has a conductive post, the conductive circuit of the optical circuit substrate is connected to the conductive post of the conductive portion in the receptor structure on a bonding surface where the optical circuit substrate is bonded with the electrical circuit substrate.

8. The substrate on which an optical element is mounted according to claim 1, wherein the optical circuit substrate has a conductive circuit on an optical-element-mounting side surface, and the conductive portion that penetrates the optical circuit substrate and is metal-bonded to the electrode of the electrical circuit substrate on the conductive circuit.

9. The substrate on which an optical element is mounted according to claim 1, wherein the optical circuit substrate has an optical path changing portion in the core portion that bends an optical path of the core portion towards a light receiving and emitting portion of the optical element.

10. The substrate on which an optical element is mounted according to claim 1, wherein the substrate on which an optical element is mounted has a structure in which the electrical circuit substrate is provided in a plurality, and the plurality of electrical circuit substrates are joined in a bridge structure by the optical circuit substrate.

11. The substrate on which an optical element is mounted according to claim 1, wherein the substrate on which an optical element is mounted is obtained by positioning an optical-element-mounting portion of the electrical circuit substrate relative to the receptor structure, by mounting the optical element on the optical circuit substrate, and by metal-bonding the electrical circuit substrate and the optical element together via the conductive portion of the receptor structure.

12. A substrate on which an optical element is mounted, comprising:

an electrical circuit substrate having an electrical circuit;

an optical circuit substrate mounted over the electrical circuit substrate and comprising an optical waveguide layer having a core portion and cladding portions; and an optical element mounted over the electrical circuit substrate and the optical circuit substrate, wherein the optical circuit substrate has a through hole in which a receptor structure having a conductive portion is provided, the conductive portion of the receptor structure is electrically connecting an electrode of the optical element and an electrode of the electrical circuit of the electrical circuit substrate, and the conductive portion in the receptor structure comprises a conductive post that is provided on a bottom portion of the receptor structure on the electrical circuit inside the through hole.

13. The substrate on which an optical element is mounted according to claim 12, wherein the optical circuit substrate has a via hole penetrating through the optical circuit substrate and a conductive post formed in the via hole and electrically connected to the electrical circuit of the electrical circuit substrate.

14. A substrate on which an optical element is mounted, comprising:

an electrical circuit substrate having an electrical circuit;

an optical circuit substrate mounted over the electrical circuit substrate and comprising an optical waveguide layer having a core portion and cladding portions; and an optical element mounted over the electrical circuit substrate and the optical circuit substrate, wherein the optical circuit substrate has a through hole in which a receptor structure having a conductive portion is provided, the conductive portion of the receptor structure is electrically connecting an electrode of the optical element and an electrode of the electrical circuit of the electrical circuit substrate, the conductive portion in the receptor structure comprises a projection portion which is provided on the electrode of the optical element, and the optical circuit substrate has a via hole penetrating through the optical circuit substrate and a conductive post formed in the via hole and electrically connected to the electrical circuit of the electrical circuit substrate.

* * * * *